United States Patent
Zeighami et al.

(10) Patent No.: US 7,002,801 B2
(45) Date of Patent: Feb. 21, 2006

(54) METHOD OF COOLING SEMICONDUCTOR DIE USING MICROCHANNEL THERMOSYPHON

(75) Inventors: Roy Zeighami, Plan, TX (US); Christian L. Belady, Mckinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/687,382

(22) Filed: Oct. 16, 2003

(65) Prior Publication Data

US 2004/0080913 A1   Apr. 29, 2004

Related U.S. Application Data

(62) Division of application No. 10/074,885, filed on Feb. 12, 2002, now Pat. No. 6,704,200.

(51) Int. Cl.
*H05K 7/20* (2006.01)
(52) U.S. Cl. ............... 361/700; 361/699; 165/104.33; 257/715; 174/15.1
(58) Field of Classification Search ........ 361/689–704, 361/715, 722, 717–720, 749–751; 174/15.1, 174/15.2, 16.3, 252; 165/46, 80.3, 80.4, 165/104.19, 104.26, 104.33; 29/890.03; 257/713–715, 721–722; 62/259.2; 428/209, 428/901
See application file for complete search history.

(56) References Cited

U.S. PATENT DOCUMENTS

| 4,450,472 A * | 5/1984 | Tuckerman et al. ........ 257/713 |
| 4,912,600 A | 3/1990 | Jaeger et al. |
| 5,057,908 A * | 10/1991 | Weber ........................ 257/714 |
| 5,203,401 A * | 4/1993 | Hamburgen et al. ....... 165/80.4 |
| 5,508,234 A * | 4/1996 | Dusablon et al. .............. 216/2 |
| 5,705,018 A | 1/1998 | Hartley |
| 5,795,788 A * | 8/1998 | Bevan et al. ................ 436/161 |
| 5,870,823 A * | 2/1999 | Bezama et al. ............... 29/848 |
| 6,031,286 A * | 2/2000 | Levine et al. ................ 257/714 |
| 6,215,166 B1 | 4/2001 | McDunn et al. |
| 6,242,778 B1 | 6/2001 | Marmillion et al. |
| 6,437,981 B1 * | 8/2002 | Newton et al. ............. 361/700 |
| 6,457,515 B1 * | 10/2002 | Vafai et al. ................ 165/80.4 |
| 6,529,377 B1 * | 3/2003 | Nelson et al. ............. 361/699 |
| 6,582,987 B1 * | 6/2003 | Jun et al. ...................... 438/49 |
| 2002/0023841 A1 | 2/2002 | Ahn et al. |

FOREIGN PATENT DOCUMENTS

JP   405308111 A * 11/1993
SU   1781735 A1 * 12/1992

* cited by examiner

*Primary Examiner*—Michael Datskovskiy

(57) ABSTRACT

The invention provides for cooling a semiconductor die. The die has plurality of micro-channels. A condenser is in fluid communication with the micro-channels such that the die heats vaporizes fluid at the die to force fluid towards the condenser, and such that gravity pressurizes cooler condenser fluid towards the die. A semiconductor plate such as glass may couple with the die to seal the micro-channels and to form a plurality of fluid conduits for the fluid. Generally, the fluid is alcohol. A first fluid conduit and a second fluid conduit couple between the die's micro-channels and the condenser to form a closed loop thermosyphon system. The condenser is preferably constructed and arranged above the die such that gravity forces cooler fluid to the micro-channels. The micro-channels may be shaped for preferential fluid flow along one direction of the die. The condenser may contain fins to enhance heat transfer to air adjacent the condenser.

6 Claims, 3 Drawing Sheets

METHOD OF COOLING SEMICONDUCTOR DIE USING MICROCHANNEL THERMOSYPHON

RELATED APPLICATION

This application is a divisional of U.S. Ser. No. 10/074,885, filed Feb. 12, 2002 now U.S. Pat. No. 6,704,200, entitled LOOP THERMOSYPHON USING MICROCHANNEL ETCHED SEMICONDUCTOR DIE AS EVAPORATOR, the aforementioned application is incorporated herein by reference thereto.

BACKGROUND OF THE INVENTION

The complexity and cost associated with power dissipation in computing systems continues to grow with increasing demands on computing performance. These systems commonly employ numerous processors, application specific integrated circuits (ASICs) and memory devices, each of which must be designed or coupled with sufficient power dissipation capacity. Direct air cooling of devices may not be sufficient in systems incorporating highly dense physical architectures; instead, liquid cooling of such devices may be required in such instances.

In the prior art, certain techniques have been employed to directly couple fluid (e.g., water or alcohol) to the semiconductor package to address increased thermal dissipation. However, approximately two-thirds of the thermal resistance between the semiconductor junction and the ambient cooling fluid is internal to the semiconductor package. Accordingly, the internal thermal impedance dominates how thermal dissipation occurs, irrespective of coupling fluid or other thermal sinks. Accordingly, a reduction of the thermal impedance is needed in order to make significant improvement in thermal dissipation.

The prior art has also attempted to incorporate micro-channels with the semiconductor element (i.e., a "die") to improve cooling efficiency. Each micro-channel is for example etched into the semiconductor substrate so as to provide increased area cooling to the substrate. By way of example, these micro-channels may form a series of "fins" in the substrate to assist in dissipating internally-generated heat. One difficulty with the prior art's use of micro-channels is that high pressure is used to couple heat transfer fluid to the die; that is, a pressure pump forces the fluid to flow through the micro-channels. This pressure pump has significant failure modes that make it risky to use within computing systems.

The prior art has also attempted to utilize "loop thermosyphon" techniques to cool the semiconductor package. Loop thermosyphon of the prior art utilizes an evaporator, such as a metal block, to thermally cool the semiconductor package with cooling liquid there between. The package heats up to generate vapor from the liquid; and the density differences between the liquid and the vapor create cooling between the evaporator and the semiconductor package. However, as discussed above, loop thermosyphon of the prior art does not solve the aforementioned reduction of the thermal impedance internal to the semiconductor package and, therefore, it does not dissipate the majority of the thermally generated energy internal to the package.

The invention provides techniques and methods for directly cooling the semiconductor die in order to reduce thermal impedances and to increase thermal dissipation, to facilitate increased performance and capacity for semiconductor devices. Other features of the invention will be apparent within the description that follows.

SUMMARY OF THE INVENTION

The invention of one aspect includes a semiconductor die (e.g., a semiconductor microprocessor) with a plurality of micro-channels etched into the die's substrate. This substrate, with the micro-channels, serves as an evaporator in a closed thermosyphon system. The system also includes a condenser in the form of a liquid-to-air heat exchanger; a liquid substantially fills the system (e.g., enough to ensure that the evaporator is "wet" or "charged", such as when the fluid fills the system to above about 50%) between the die evaporator and heat exchanger. The condenser may be above the die so that vapor gas generated from interaction of fluid with the die moves upwards to the heat exchanger, which simultaneously forces cooler liquid towards the die (and particularly through the micro-channels).

The condenser may take several forms in order to transfer heat from the die to the outside environment, i.e., to the air outside the heat exchanger. For purposes of illustration, the condenser may for example operate similar to a car radiator, where engine heat transfers to outside ambient air through the car radiator.

The micro-channels in the die are sealed with another piece of silicon (e.g., glass) so as to form conduits for fluid flow through the micro-channels. In a preferred aspect, the micro-channels are shaped to encourage fluid flow preferentially in a particular direction through the conduits. By way of example, in one aspect the channels are narrower at one end than the other. In another aspect, an orifice restricts fluid passage to encourage preferential fluid flow direction.

In yet another aspect, an input header couples cooler input fluid to the micro-channel conduits, and an output header couples vapor and warmer output fluid from the micro-channel conduits to the condenser.

One advantage of the invention is that fluid flow occurs without the use of a pump. Heating from the die, and vapor generated by fluid interaction with the die, causes natural circulation through the micro-channels to the condenser and back to the die. Effectively, the die is the engine or pump for the closed-loop thermosyphon system of the invention.

In one aspect, a system of the invention cools a semiconductor die. The die has a plurality of micro-channels. A condenser is in fluid communication with the micro-channels such that the die heats and vaporizes fluid at the die to force fluid towards the condenser, and such that gravity pressurizes cooler condenser fluid towards the die In one aspect, a plate (e.g., a semiconductor material like silicon or glass) couples with the die to seal the micro-channels such that the micro-channels form a plurality of fluid conduits for the fluid.

The loop thermosyphon system of the invention preferably has closed loop fluid communication between the die and condenser. A fluid such as water, Fluorinert or alcohol may be used to form the closed loop communication path; other liquids may also be used. A first fluid conduit may couple cooler fluid from the condenser to the micro-channels. A first header may couple the first fluid conduit to the micro-channels. A second fluid conduit may couple warmer fluid from the micro-channels to the condenser. A second header may couple the second fluid conduit to the micro-channels.

In a preferred aspect, the micro-channels are shaped for preferential fluid flow along one direction in the micro-channels. Micro-channels of the invention are preferably etched by techniques known in the art. Alternatively, one or more physical orifices, within the micro-channels, may preferentially restrict fluid flow along one direction of the micro-channels.

In the preferred aspect of the invention, the condenser is also constructed and arranged above the die such that gravity forces cooler fluid to the micro-channels. Gravity may provide the initial pressurization to form a circular fluid flow through the system; as the die warms up to boil the fluid, vapor adds additional pressure to further encourage the circular fluid flow. The condenser may utilize fins to enhance heat transfer to air adjacent the condenser.

In another aspect, a method is provided for cooling a semiconductor die. The method includes the steps of: flowing fluid through micro-channels formed into the die; communicating fluid from the die to a condenser arranged above the die; cooling fluid at the condenser; and communicating fluid from the condenser to the micro-channels.

In one aspect, the step of flowing may include the step of flowing fluid through the micro-channels bounded, at least in part, by a semiconductor compatible element (e.g., silicon) coupled with the die. By way of example, the semiconductor element may be a glass plate.

In another aspect, the method includes the step of shaping the micro-channels for preferential fluid flow along the micro-channels.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which.

DETAILED DESCRIPTION OF THE DRAWINGS

Figure 1:
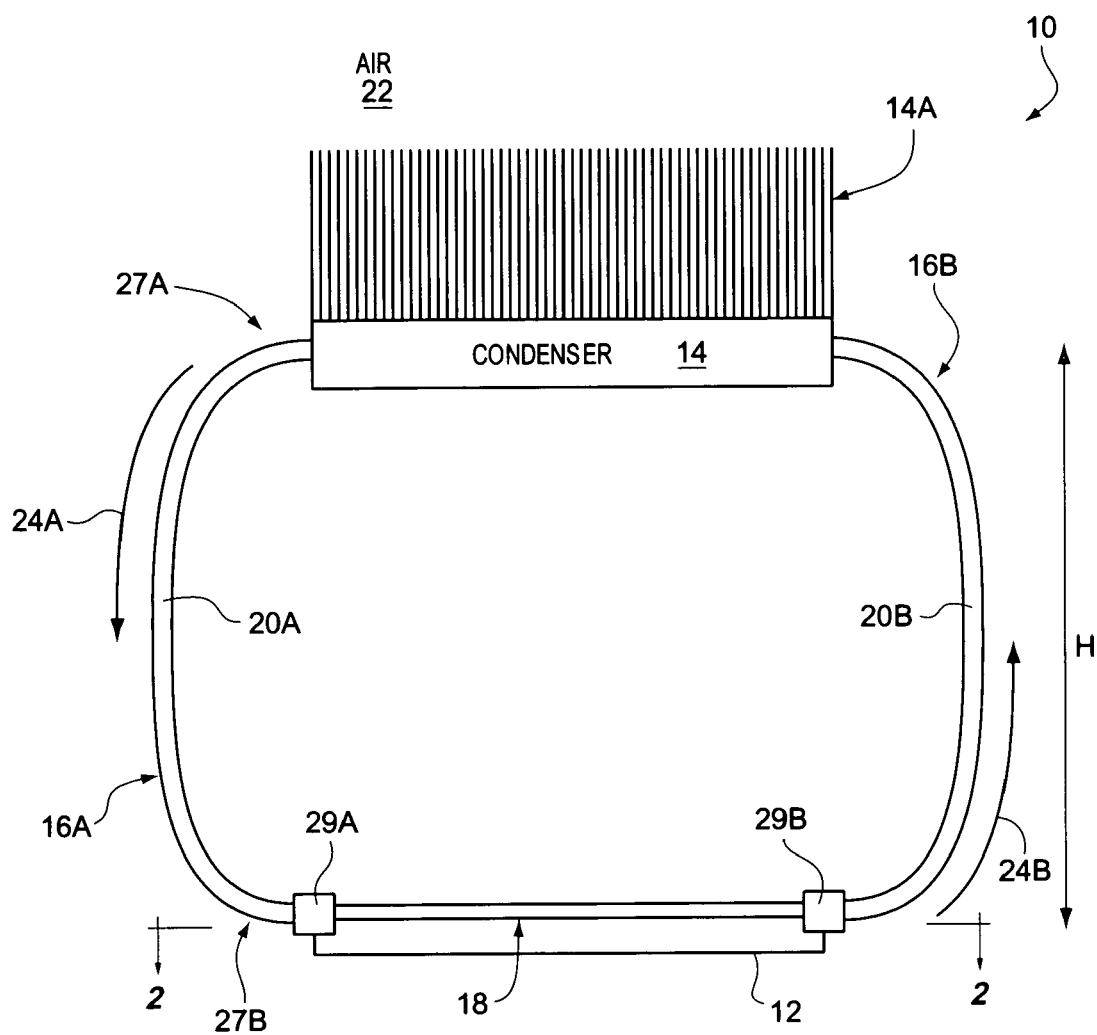
FIG. 1 shows a schematic view of a closed-loop thermosyphon system of the invention.

FIG. 1 shows a schematic view of a loop thermosyphon system 10 of the invention. System 10 has a die 12 coupled to a condenser 14 via a closed-loop fluid pressure conduit 16A/16B. Die 12 has a plurality of micro-channels 18 formed into its substrate, such as described and shown in more detail below. Condenser 14 is a heat-exchanger that cools fluid 20A/20B within system 10 by convection with air 22 adjacent to condenser 14. For example, condenser 14 is shown with a series of fins 14A to enhance heat transfer to air 22. Though not required, condenser 14 is above die 12 and spaced a distance "H" away to provide sufficient fluid pressure to drive fluid through micro-channels 18, such as described herein. In the preferred embodiment, this pressurized action drives fluid 20A/20B within conduit 16A from condenser 14 and along direction 24A; heated fluid and vapor 20B generated by interaction of fluid 20 with die 12 also drives fluid flow within conduit 16B and along direction 24B. As described below, in the preferred embodiment, a header 29A facilitates coupling between conduit 16A and die 12; a header 29B facilitates coupling between die 12 and conduit 16B.

Those skilled in the art should appreciate that condenser 14 may take other forms without departing from the scope of the invention. For example, condenser 14 may be formed of a heat sink or even another die, as a matter of design choice. In operation, condenser 14 rejects heat to ambient air 22. A fluid and vapor mix 20B enters condenser 14 through conduit 16B, and fluid 20A leaves condenser 14 through conduit 16A. As die 12 boils fluid 20A to create mix 20B, pressure forces act to push liquid 20A downwards to die 12—creating a naturally circular flow 24A, 24B within system 10. More particularly, the pressure difference between the top 27A and the bottom 27B of liquid 20A within conduit 16A is approximately ($\sigma*g*H$), where $\sigma$ is the liquid density of liquid 20A and g is the acceleration due to gravity (9.81 m/s$^2$). This pressure difference generally initiates the fluid flow around direction 24A, 24B; subsequent heating of the die further influences fluid flow 24A, 24B.

Figure 2:
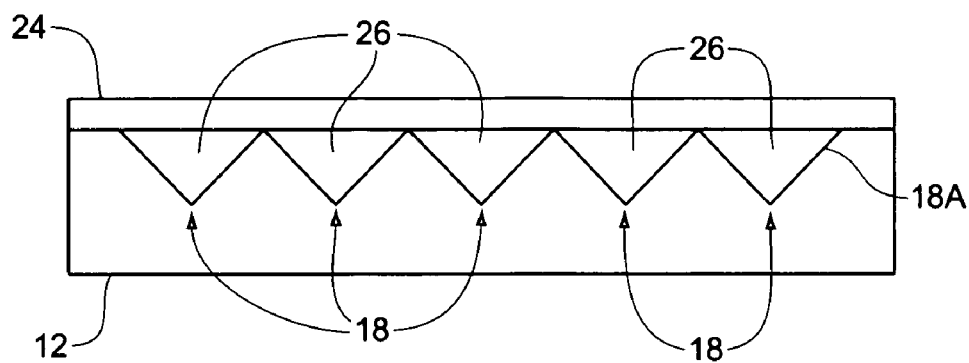
FIG. 2 illustrates a side-view of a die with a plurality of micro-channels sealed by a silicon plate to form a plurality of fluid conduits, in accord with the invention.
Figure 2A:
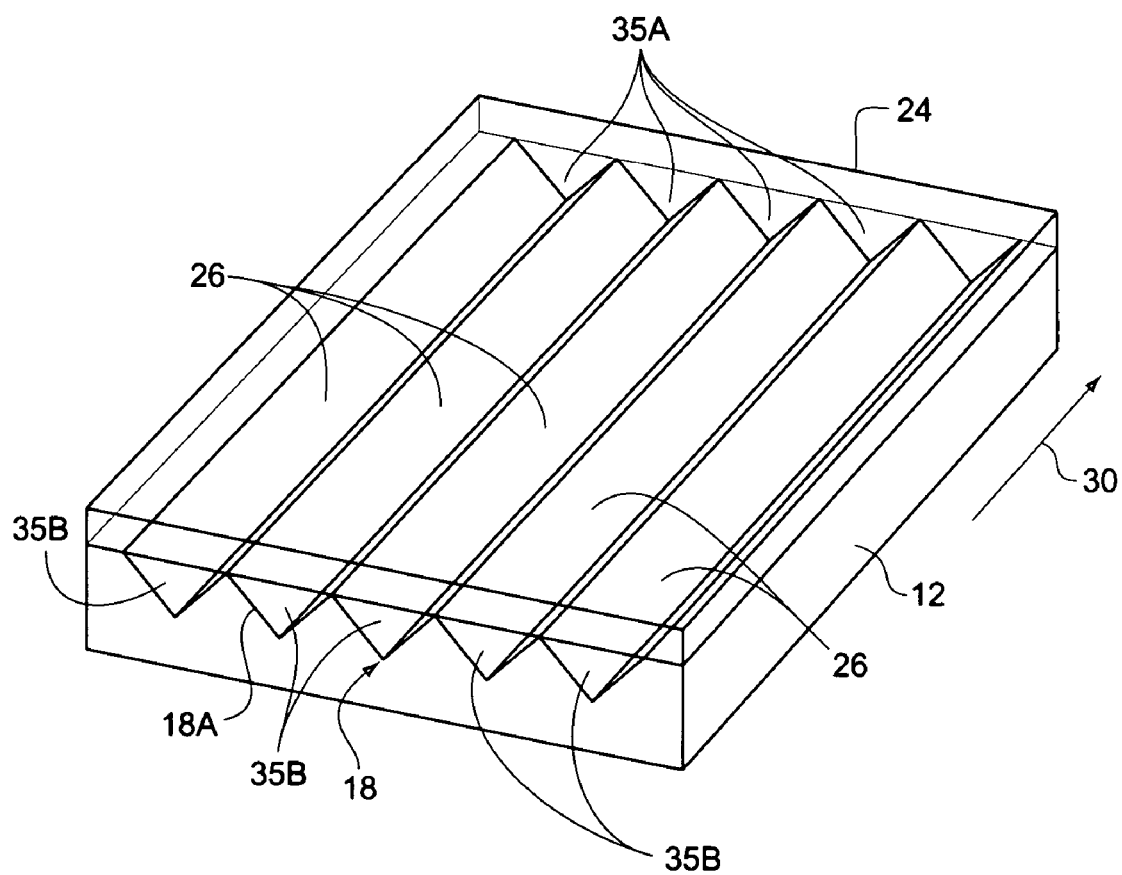
FIG. 2A shows a perspective view of the die of FIG. 2.

FIG. 2 shows a cross-sectional side view (not to scale) of die 12 with a plurality of micro-channels 18 etched into die 12 (as shown by etch line 18A). A silicon plate 24 (e.g., glass) may be used to seal micro-channels 18 so as to form a series of fluid conduits 26. Conduits 26, conduits 16A/16B and condenser 14 form a closed loop fluid communication path. FIG. 2A shows a perspective view of die 12 with a transparent plate 24. FIG. 2A also illustrates apertures 35A/35B formed at either entrance of micro-channel 18 with die 12. As described in more detail below, apertures 35A at the die's outlet (i.e., at header 29B) are larger than apertures 35B at the die's inlet (i.e., at header 29A) so as to encourage preferential fluid flow along direction 30.

Figure 3:
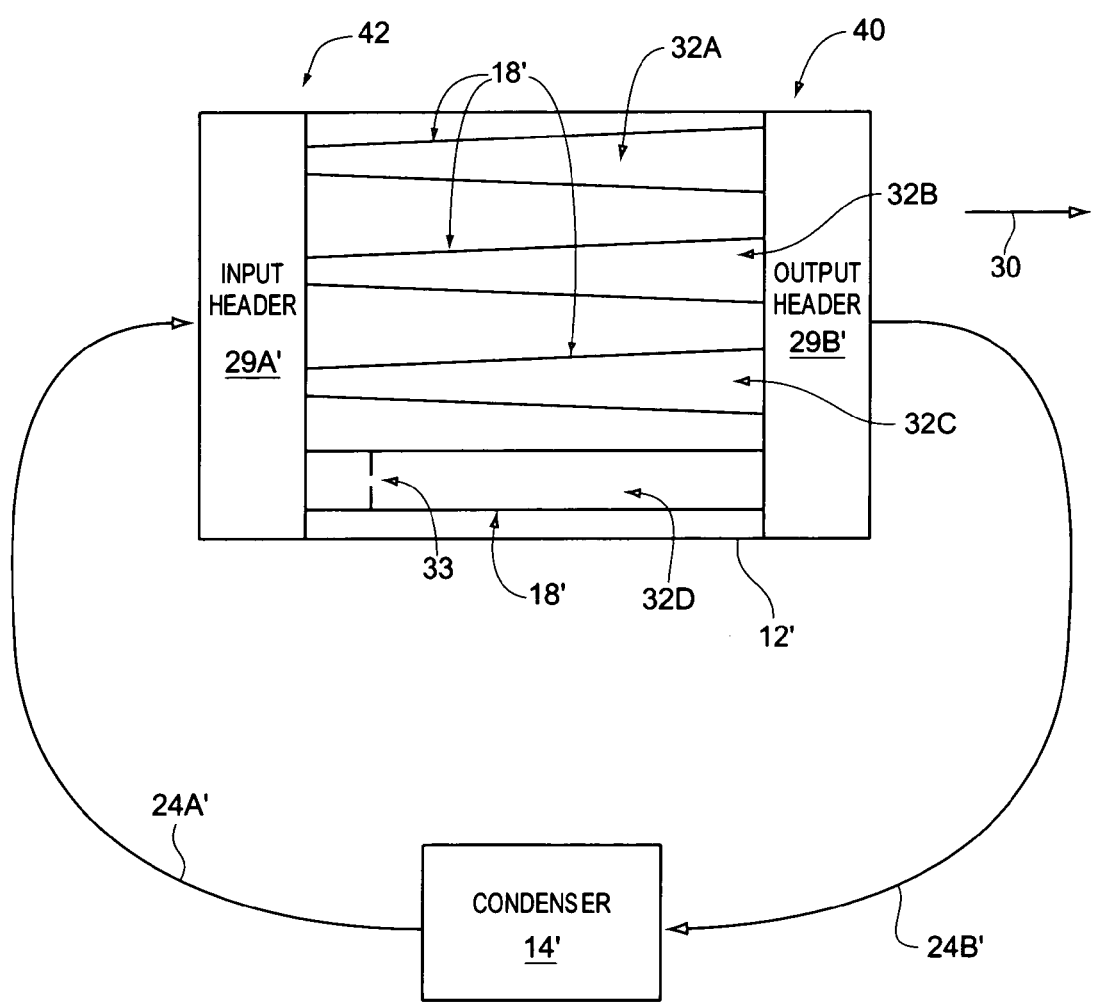
FIG. 3 shows a schematic top view illustrating operational pumping action through a die's micro-channels and headers, in accord with the invention.

FIG. 3 shows a top view of one die 12' without a top plate 24 to illustrate how micro-channels of the invention may be shaped or configured to preferentially flow fluid along one direction 30. Specifically, die 12' is shown with four fluid conduits 32A, 32B, 32C and 32D formed by micro-channels 18' etched in die 12'. Normally, each conduit 32 is substantially the same; however FIG. 3 shows, for illustrative purposes, one different conduit 32D that achieves the same preferential fluid flow via an orifice 33. In the preferred embodiment, conduits 32A, 32B, 32C are formed by shaping of micro-channels 18' so as to encourage fluid flow along direction 30. By way of example, as shown, micro-channels 18' are shaped with so that conduits 32A, 32B, 32C form a larger aperture (35A, FIG. 2A) at the right side 40 of die 12' as compared to respective apertures (35B, FIG. 2A) at the left side 42 of die 12'. Accordingly, conduits 32A, 32B, 32C are narrower at side 42 as compared with side 40.

Those skilled in the art should appreciate that conduits 32 may be formed into other shapes to achieve similar effects and without departing from the scope of the invention. Furthermore, other restrictive elements—such as orifice 32 may be incorporated within a conduit 32D to achieve like effects.

FIG. 3 also shows the preferred fluid flow direction between die 12' and condenser 14'. In particular, fluid from condenser 14' preferably flows along direction 24A' for input to header 29A'; fluid leaves die 12' through header 29B' to travel along direction 24B' to condenser 14'.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

What is claimed is:

1. A method of cooling a semiconductor die, comprising the steps of:
    flowing fluid through micro-channels formed into the die;
    communicating fluid from the die to a condenser arranged above the die;
    cooling fluid at the condenser; and
    communicating fluid from the condenser to the micro-channels.

2. A method of claim 1, the step of flowing comprising flowing fluid through the micro-channels bounded, at least in part, by a semiconductor element coupled with the die.

3. A method of claim 2, the semiconductor element comprising one of silicon and a glass plate.

4. A method of claim 1, further comprising the step of shaping the micro-channels for preferential fluid flow along the micro-channels.

5. A method of claim 1, the steps of communicating comprising utilizing headers coupled with the micro-channels.

6. A method of claim 1, the step of communicating fluid from the condenser to the micro-channels comprising utilizing gravity to force the fluid to the die.

* * * * *